(12) United States Patent
Hotta et al.

(10) Patent No.: US 9,570,279 B2
(45) Date of Patent: Feb. 14, 2017

(54) TWO ROTATING ELECTRIC FIELDS MASS ANALYZER

(71) Applicant: OFFICE TANDEM L.L.C., Tokyo (JP)

(72) Inventors: Masanao Hotta, Tokyo (JP); Tatsuya Adachi, Shizuoka (JP)

(73) Assignee: OFFICE TANDEM L.L.C., Tokyo (JP)

( * ) Notice: Subject to any disclaimer, the term of this patent is extended or adjusted under 35 U.S.C. 154(b) by 0 days.

(21) Appl. No.: 14/768,048

(22) PCT Filed: Feb. 7, 2014

(86) PCT No.: PCT/JP2014/053569
§ 371 (c)(1),
(2) Date: Aug. 14, 2015

(87) PCT Pub. No.: WO2014/126227
PCT Pub. Date: Aug. 21, 2014

(65) Prior Publication Data
US 2015/0380227 A1 Dec. 31, 2015

(30) Foreign Application Priority Data

Feb. 14, 2013 (JP) ................................. 2013-027052

(51) Int. Cl.
*H01J 49/06* (2006.01)
*H01J 37/05* (2006.01)
(Continued)

(52) U.S. Cl.
CPC ............... *H01J 49/06* (2013.01); *H01J 37/05* (2013.01); *H01J 49/26* (2013.01); *H01J 49/36* (2013.01);
(Continued)

(58) Field of Classification Search
USPC ........................................................ 250/281
See application file for complete search history.

(56) References Cited

U.S. PATENT DOCUMENTS

| | | | | |
|---|---|---|---|---|
| 5,726,448 A | * | 3/1998 | Smith | ................... H01J 49/421 250/290 |
| 6,759,651 B1 | * | 7/2004 | Li | ........................ H01J 49/062 250/288 |

(Continued)

FOREIGN PATENT DOCUMENTS

| JP | 2003-263970 | 9/2003 |
|---|---|---|
| JP | 2006-190526 | 7/2006 |

(Continued)

OTHER PUBLICATIONS

International Search Report issued Mar. 18, 2014 in corresponding International Application No. PCT/JP2014/053569.
(Continued)

*Primary Examiner* — Phillip A Johnston
(74) *Attorney, Agent, or Firm* — Wenderoth, Lind & Ponack, L.L.P.

(57) ABSTRACT

A mass analyzer includes two rotating electric field (REF) units, sinusoidal signal generators and a means for separation of dispersed ions. The REF units include a plurality of elongated electrodes surrounding a central axis, and are lined in tandem at elongated direction. Sinusoidal signals are applied to the electrodes to rotate electric fields within each REF unit. The means for separation is placed adjacent the downstream end of the $2^{nd}$ REF unit. Ions enter the $1^{st}$ REF unit, diverge outwards and leave the $1^{st}$ REF unit on off-axis positions. The ions successively enter the $2^{nd}$ REF unit and converge inwards because of 180 degrees phase difference from the $1^{st}$ REF unit. Specified mass ions return to and travel along the central axis. However, unspecified mass ions deviate from the central axis and travel apart from the central axis. The means for separation separates specified ions from unspecified ions.

4 Claims, 7 Drawing Sheets

(51) Int. Cl.
  *H01J 49/42* (2006.01)
  *H01J 49/26* (2006.01)
  *H01J 49/36* (2006.01)
  *H01J 37/244* (2006.01)
  *H01J 37/252* (2006.01)

(52) U.S. Cl.
  CPC ............ *H01J 49/421* (2013.01); *H01J 37/244* (2013.01); *H01J 37/252* (2013.01)

(56) References Cited

U.S. PATENT DOCUMENTS

| | | | |
|---|---|---|---|
| 6,791,077 | B1 | 9/2004 | Farnsworth |
| 6,794,647 | B2 | 9/2004 | Farnsworth et al. |
| 7,388,196 | B1 | 6/2008 | Hagerman |
| 7,547,878 | B2 * | 6/2009 | Schultz ................ G01N 27/622 250/281 |
| 7,964,021 | B2 | 6/2011 | Younsi et al. |
| 8,378,297 | B2 | 2/2013 | Vidal-De-Miguel |
| 2003/0201387 | A1 | 10/2003 | Hartley et al. |
| 2006/0243903 | A1 | 11/2006 | Wang |
| 2010/0243883 | A1 * | 9/2010 | Vidal-De-Miguel G01N 27/624 250/282 |
| 2012/0256082 | A1 | 10/2012 | Masujima et al. |

FOREIGN PATENT DOCUMENTS

| | | |
|---|---|---|
| JP | 2007-234508 | 9/2007 |
| JP | 2012-216527 | 11/2012 |

OTHER PUBLICATIONS

Kramer et al., "A New High Frequency Mass Spectrograph," Ind. Chim Belge, 19, pp. 705-706, 1954.

Clemmons et al., "Mass spectroscopy using a rotating electric field," Rev. Sci. Instrum., 69, pp. 2285-2291, 1998.

Ohwaki et al., "Development of a new cluster size selector," Nuclear Instruments and Methods in Physics Research, vol. 241, pp. 614-617, 2005.

Extended European Search Report issued Sep. 6, 2016 in European Application No. 14752094.4.

Mima H et al., "Path Stability Mass Spectrometer", Memoirs of the Faculty of Engineering, Osaka City University, OsakaShiritsu Daigaku Kobakubu, Osaka, Japan, vol. 9, Dec. 1, 1967, pp. 143-149, XP008052318, ISSN: 0078-6659.

Yuki Anai et al., "Development of Mass Spectrometer Using Two Rotating Electric Fields for Separation of High-Mass Ions", e-Journal of Surface Science and Nanotechnology, May 28, 2016, pp. 161-164, XP055297466, URL:https://www.jstage.jst.go.jp/article/ejssnt/14/0/14_161/_pdf.

* cited by examiner

Trajectries of Ar4000 & Ar3999

TWO ROTATING ELECTRIC FIELDS MASS ANALYZER

TECHNICAL FIELD

The present invention relates to a mass analyzing apparatus including two rotating electric fields for dispersing ions, and may find application of a mass-analyzing filter in an ion beam optical column or of a mass analyzer in a secondary ion mass spectrometer. The invention relates in particular to a small and lightweight mass analyzing apparatus having an ability to analyze ions in the range of mass from 1 to over 100,000 Da, enabling continuous separation of ions.

BACKGROUND ART

Mass analysis has been a basic technology to quantify molecular and atomic composition of various materials. Quantitative information obtained by mass analysis of molecules or atoms reveals chemical and physical characteristics of the materials. Today, three types of mass analyzers are commonly used in the field of mass analysis.

Magnetic sector analyzers disperse ions by mass utilizing magnetic force. The advantage of this type of analyzer is that each selected ion preserves its structure and feature as an ion beam. Magnetic sector analyzers work mainly in the range of mass under 10,000 Da, but should be bulky and heavy to analyze ions in the range over 10,000 Da.

A quadrupole mass analyzer comprises 4 rods on which DC (direct current) voltage and high frequency signals are applied. Only the ions of mass that match the electrical condition oscillate stably within the space surrounded by the 4 rods, pass through the space and arrive at the detector. Quadrupole mass analyzers work also in the range of mass under 10,000 Da. Although the resolution is not as high as magnetic sector analyzers, quadrupole mass analyzers are commonly used in research and industrial fields because they are compact and fairly easy to handle.

Time of flight (TOF) mass analyzers measure the transit time of ions utilizing the principle that the velocities of accelerated ions vary according to their mass. It goes without saying that TOF mass analyzers are noted for their wide mass range. As the upper limit of mass range depends on the length of the measurement time, it can be set long enough. On the other hand, this feature is the crucial point for this type of analyzers to raise their time efficiency, because the analyzers have to wait for the arrival of the heaviest pulsed ion at the detector for every measurement.

There are some other types of analyzers using rotating electric fields or time dependent electric fields for mass analysis, although they are not used as commonly as the three types of analyzers said above.

One attempt is found in U.S. Pat. No. 5,726,448, where 'an ion beam is accelerated into the cell and the rotating electric field disperses the incident ion beam according to the mass to charge ratio and velocity distribution present in the ion beam'. A resolution is shown as 'better than one part in 100 for a well defined beam'. Another 'unique design' is introduced in U.S. Pat. No. 6,794,647, where 'a non-rotating, oscillating electric field that oscillates principally in a single coordinate plane' select ions. Detailed description on mass resolution and mass range are not found, however. J. Kramer used 'two identical deflectors' and 'one electrostatic lens' located between the two deflectors to deflect ions. His instrument is described as 'a time of flight mass spectrograph using a continuous ion beam'. J. H. Clemmons employed 'a time-dependent electric field and a position-sensitive detector'. His instrument does not disperse ions, but determines the mass from detected particle position and detection time. K. Ohwaki's device 'consists of two sets of electrodes that supply same sinusoidal electric field with same frequency but different phases and utilizes the difference of cluster velocity for selection'. As to mass resolution, however, it is estimated to be around 3 read from FIG. 4 in his paper.

During the past two decades, a great amount of new information and knowledge has been accumulated due to improved technologies of mass analysis, especially in the field of biochemistry and bio-medical research, and the tendency of using mass analysis of organic materials will grow enormously if an analyzer that fulfills all the functions and features of said analyzers is developed. The present invention is an improved versatile mass analyzer comprising two rotating electric fields and has features as follows:

1. An ability to analyze ion beams continuously as Magnetic sector mass analyzers do;
2. An ability to separate ions in the form of an ion beam as Magnetic sector mass analyzers do;
3. A compact and light weight body as Quadrupole mass analyzers have; and
4. An ability to analyze in the range of mass over 10,000 Da as TOF mass analyzers do.

More precise explanation will be made in the following Summary of Invention and Description of Embodiments.

CITATION LIST

Patent Literature

PTL 1: Japanese laid-open patent publication No. 2007-234508
PTL 2: U.S. Pat. No. 5,726,448
PTL 3: U.S. Pat. No. 6,794,647
PTL 4: U.S. Patent Application Publication No. US 2006/0243903 A1

Non Patent Literature

NPL 1: J. Kramer and J. B. Le Poole, A new high frequency mass spectrograph, *Ind. Chim. Belge,* 19, pp. 705-706, 1954.
NPL 2: J. H. Clemmons and E A. Herrero, Mass spectroscopy using a rotating electric field, *Rev. Sci. Instrum,* 69, pp. 2285-2291, 1998.
NPL 3: K. Ohwaki, Y. Dake, N. Toyoda and I. Yamada, Development of a new cluster size selector, *Nucl. Instrum. Meth*, B, 241, pp. 614-617, 2005.

SUMMARY OF INVENTION

Solution to Problem

Two rotating electric field (REF) units and high frequency (HF) sinusoidal signal generators perform crucial functions in the present invention. Two REF units (named the $1^{st}$ REF unit and the $2^{nd}$ REF unit) are lined in tandem, the $2^{nd}$ REF unit placed adjacent the downstream end of the $1^{st}$ REF unit, in the elongated direction leaving some distance between the two units that corresponds to a drift region for ion beams to travel freely. Each REF unit comprises a plurality of elongated electrodes positioned parallel to and equidistant from a central axis along which the ions traveled till incidence. The upstream plane of each REF unit is an inlet and the downstream plane is an outlet for ion beams. The central axis runs through the center of the inlet and that of the outlet. Sinusoidal signals of different phases are applied to each electrode and rotate electric fields within each REF unit. Within the $2^{nd}$ REF unit, the electric field rotates with reversed electric field direction compared to the $1^{st}$ REF unit.

When ions are injected into the $1^{st}$ REF unit, the ions experience lateral force from the rotating electric field and diverge outward like water droplets of a sprinkler spray moving away from the central axis. If there is no following electric field, ions never return to the central axis after leaving the $1^{st}$ REF unit. In the present invention, ions injected into the $2^{nd}$ REF unit converge inward because of its reversed electric field and reversed lateral force.

When the rotating period of the electric field of the $1^{st}$ REF unit is chosen to be equal to the transit time of an ion in the $1^{st}$ REF unit, the incident ion leaves the $1^{st}$ REF unit at a point having some distance from the central axis. The ion travels the drift region in parallel to the central axis. Because all lateral force is canceled during one cycle exposure in the $1^{st}$ REF unit, the ion has no lateral velocity.

After entering the $2^{nd}$ REF unit, the ion converges towards the central axis affected by the inversed lateral force of the rotating electric field. The displacement of the ion caused in the $1^{st}$ REF unit is canceled within the $2^{nd}$ REF unit by the reverse electric field. When the ion leaves the $2^{nd}$ REF unit, it has no lateral velocity as in the case of the $1^{st}$ REF unit. Thus, the ion leaves the $2^{nd}$ REF unit at the center of the outlet and travels on the central axis.

On the other hand, ions having different transit time from the period of the rotating electric field leave the $1^{st}$ REF unit with some lateral velocity. Because these ions stay in the rotating electric field shorter or longer time than one cycle, lateral force is not canceled. Ions having different transit time leave the $1^{st}$ REF unit with inclined trajectories. Such ions do not travel the drift region in parallel to the central axis and enter the $2^{nd}$ REF unit with different radial distance from the central axis. This time, their displacement cannot be canceled within the $2^{nd}$ REF unit and they leave the $2^{nd}$ REF unit at a point apart from the central axis. Thus, ions travel on different trajectories corresponding to their velocity after passing the two rotating electric fields.

Since ions have their own velocity and transit time corresponding to their mass, by changing the rotating period of the electric fields, ions of different mass can be converged on to the central axis. By adjusting the period and the phase of the two rotating electric fields to the velocity of the specified mass ions, the 'specified mass ion' meaning the ion intended to be selected by mass analysis, the present invention can analyze ions in the range of mass from 1 to over 100,000 Da. Further features and advantages of the present invention will be made apparent in Description of Embodiments in connection with accompanying drawings.

DESCRIPTION OF EMBODIMENTS

Figure 1:
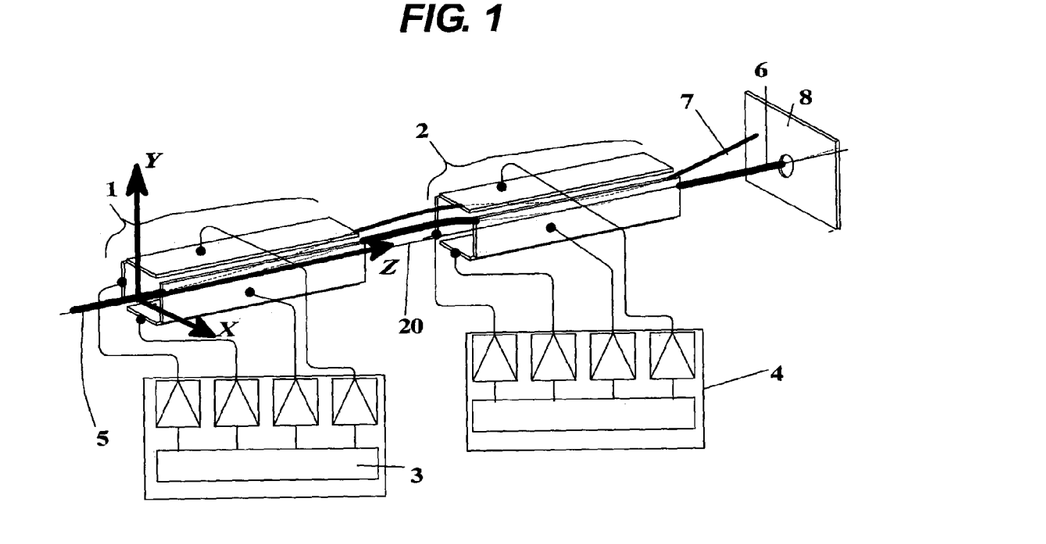
FIG. 1 illustrates a perspective view of an embodiment of the present invention.
Figure 2:
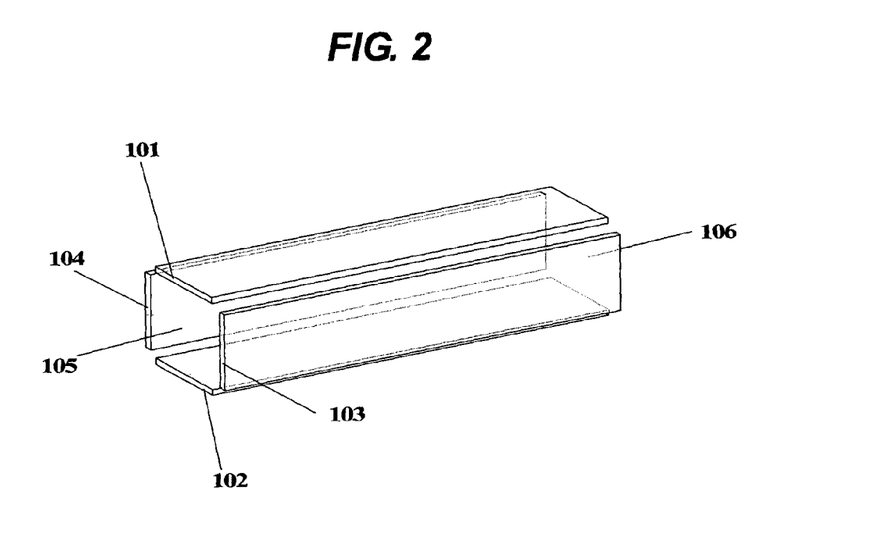
FIG. 2 illustrates an embodiment of a REF unit in FIG. 1.

The present invention comprises two rotating electric field (REF) units, high frequency (HF) sinusoidal signal generators and a means for separation of dispersed ions. An REF unit comprises a plurality of elongated electrodes. FIG. 1 illustrates an embodiment of the present invention. The $1^{st}$ REF unit 1 and the $2^{nd}$ REF unit 2 are placed in tandem in the elongated direction leaving a drift space for ions between the two units. Sinusoidal signals from the high frequency (HF) sinusoidal signal generators 3 and 4 are applied to the electrodes of the $1^{st}$ REF unit 1 and the $2^{nd}$ REF unit 2 respectively. The HF sinusoidal signal generators send out a plurality of sinusoidal signals to all the electrodes with different phases to rotate electric fields within each REF unit. The period of the sinusoidal signal is equal to the transit time of a specified mass ion in the effective length of the first rotating electric field and equal to the period of the rotating electric field. An embodiment of an REF unit is illustrated in FIG. 2. The REF unit has elongated electrodes; 101, 102, 103 and 104, positioned parallel to and equidistant from the central axis 20. The embodiment has 4 electrodes, but 6 or more electrodes are allowable. The upstream face is an inlet 105 and the downstream face is an outlet 106.

Injected ions 5 entering into the first REF unit 1 at the center of the inlet 105 diverge following cycloid curves and leave the $1^{st}$ REF unit from the outlet 106 at a certain radius determined by the mass of the ions. Leaving the $1^{st}$ REF unit, ions travel across the drift region from the $1^{st}$ REF unit to the $2^{nd}$ REF unit tracing hollow cones.

In the $2^{nd}$ REF unit 2, specified mass ions 6 move inward from incident positions towards the central axis and are ejected from the center of the outlet of the $2^{nd}$ REF unit 2 to travel on the central axis. On the other hand, unspecified mass ions 7 converge to off axis directions and are ejected from the outlet at off axis positions corresponding to their mass.

An aperture plate 8 located adjacent the downstream end of the $2^{nd}$ REF unit as a means for separation of dispersed ions allows only specified mass ions 6 to pass through. After passing through the aperture, the specified ions make an ion beam of the same diameter as the diameter before incidence to the $1^{st}$ REF unit.

Figure 3:
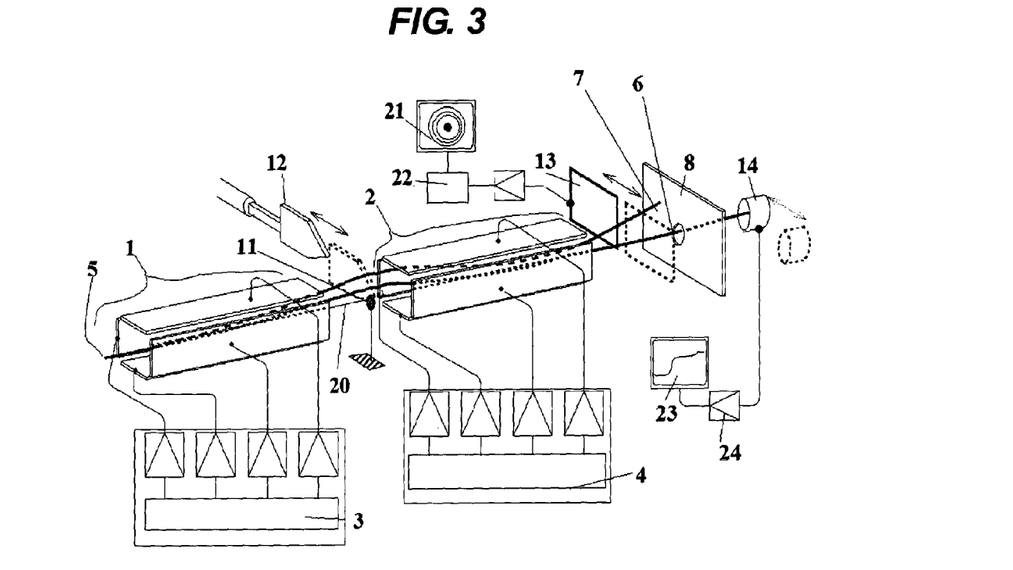
FIG. 3 illustrates a perspective view of another embodiment of the present invention.

As illustrated in FIG. 3, the present invention further comprises a collision disc 11 preventing stray ions and neutral particles from entering into the 2nd REF unit, a beam trimmer 12 to prevent a part of ion beams tracing hollow cones from traveling further, a two-dimensional (2-D) charge sensitive detector 13 located adjacent the downstream end of the 2$^{nd}$ REF unit as another means for separation of dispersed ions measuring the distribution of dispersed ions ejected from the 2$^{nd}$ REF unit, an ion current measurement device 14 located adjacent the downstream end of the aperture plate to quantify the amount of selected ions, a display 21 to show the distribution of ions, a signal amplifier 22 to amplify the signals from the 2-D charge sensitive detector 13, a display 23 to show the amount of ions selected by the aperture plate and an amplifier 24 to amplify the signals from the ion current measurement device 14. The beam trimmer 12, the 2-D charge sensitive detector 13 and the ion current measurement device 14 are designed to change their positions between the working position and the idling position.

Figure 4:
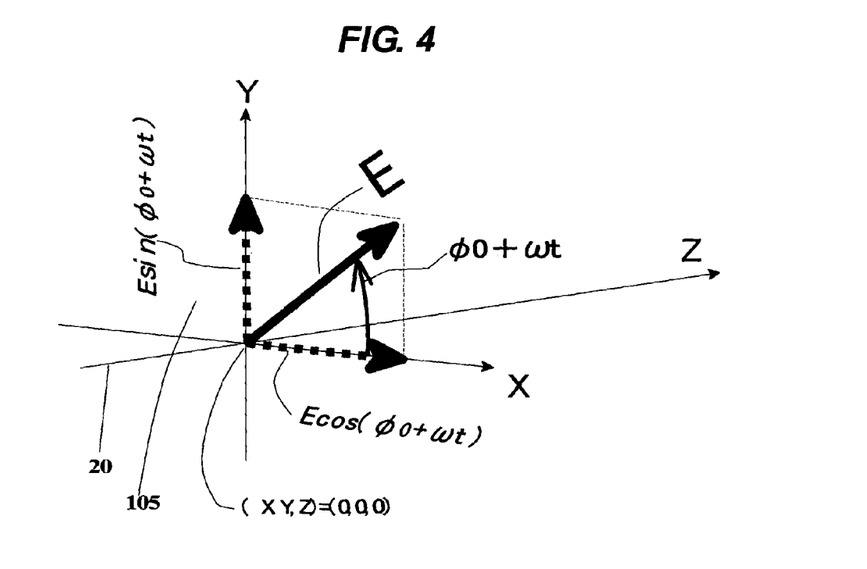
FIG. 4 illustrates a Cartesian coordinate system used in calculations in the present invention.

FIG. 4 illustrates the coordinate system used in motion analysis of ions, where the z-axis is coincident with the central axis 20 and the x-y plane intersects with the z-axis at the center of the inlet 105 of the 1$^{st}$ REF unit.

In motion analysis, angular velocity ($\omega$) of rotating electric fields is used to indicate the time dependency of electric fields. The relationship of angular velocity and sinusoidal signal period is explained in the equation [1].

$$\omega = 2\pi f = 2\pi \frac{1}{\tau} = \frac{2\pi}{T_1} = \frac{2\pi}{L}\sqrt{\frac{2qV_{acc}}{m_0}} \quad [1]$$

where:
f is the frequency of the sinusoidal signal;
$\tau$ is the period of the sinusoidal signal;
$m_0$ is the specified mass of an ion to be selected;
q is the charge on the ion;
$V_{acc}$ is the initial potential of ions;
$T_1$ is the transit time of the specified ion in the 1$^{st}$ REF unit; and L is the effective length of the rotating electric field.

The motion of an ion having mass m within the 1$^{st}$ REF unit is described by motion equations as follows:

$$m\frac{dv_x}{dt} = qE\cos(\phi_0 + \omega t) \quad [2]$$

$$m\frac{dv_y}{dt} = qE\sin(\phi_0 + \omega t) \quad [3]$$

$$m\frac{dv_z}{dt} = 0 \quad [4]$$

where:
m is the mass of an ion;
$v_x$ is the velocity of the ion along the x-axis;
$v_y$ is the velocity of the ion along the y-axis;
$v_z$ is the velocity of the ion along the z-axis;
E is the field strength of the rotating electric field;
$\phi_0$ is the initial phase angle of the rotating electric field of the 1$^{st}$ REF unit at the moment of the ion incidence into the 1$^{st}$ REF unit; and
t is the transit time measured from the moment of the ion incidence into the 1$^{st}$ REF unit.

Integrating equations [2], [3] and [4], velocities of each direction are obtained as follows:

$$v_x = \frac{qE}{m\omega}\{\sin(\phi_0 + \omega t) - \sin(\phi_0)\} + v_{x10} \quad [5]$$

$$v_y = \frac{qE}{m\omega}\{-\cos(\phi_0 + \omega t) + \cos(\phi_0)\} + v_{y10} \quad [6]$$

$$v_z = Const = \sqrt{\frac{2qV_{acc}}{m}} \quad [7]$$

where:
$v_{x10}$ is the velocity of the ion along the x-axis at t=0; and
$v_{y10}$ is the velocity of the ion along the y-axis at t=0.

Integration of [5], [6] and [7] provides positional coordinates of the ion.

$$x = \frac{qE}{m\omega^2}\{-\cos(\phi_0 + \omega t) - \sin(\phi_0)\omega t + \cos(\phi_0)\} + v_{x10}t + x_{10} \quad [8]$$

$$y = \frac{qE}{m\omega^2}\{-\sin(\phi_0 + \omega t) + \cos(\phi_0)\omega t + \sin(\phi_0)\} + v_{y10}t + y_{10} \quad [9]$$

$$z = \sqrt{\frac{2qV_{acc}}{m}}\, t \quad [10]$$

where:
$x_{10}$ is the x-coordinate of the position of the ion at t=0; and
$y_{10}$ is the y-coordinate of the position of the ion at t=0.

Equations [8], [9] are parametric equations for a cycloid curve and they show that the ion has a certain distance from the central axis corresponding to its mass and velocity after passing the 1$^{st}$ REF unit.

The ion injected into the 2$^{nd}$ REF unit 2 moves inward receiving the inversed force from the rotating electric fields. The motion is investigated as follows.

The ion motion in the 2$^{nd}$ REF unit has the form:

$$m\frac{dv_x}{dt} = qE\cos(\phi_0 - \pi + \omega(t - T_2)) \quad [11]$$

$$m\frac{dv_y}{dt} = qE\sin(\phi_0 - \pi + \omega(t - T_2)) \quad [12]$$

$$m\frac{dv_z}{dt} = 0 \quad [13]$$

where:
$T_2$ is the transit time of the ion having mass $m_0$ from the inlet of the 1$^{st}$ REF unit to the inlet of the 2$^{nd}$ REF unit:

Integration of equations [11] and [12] yields the velocity equations as $$v_x = \frac{qE}{m\omega}\{-\sin(\phi_0 + \omega(t - T_2)) + \sin(\phi_0 + \omega(t_2 - T_2))\} + v_{x20} \quad [14]$$

$$v_y = \frac{qE}{m\omega}\{\cos(\phi_0 + \omega(t - T_2)) - \cos(\phi_0 + \omega(t_2 - T_2))\} + v_{y20} \quad [15]$$

where:
$t_2$ is the transit time of the ion having mass m from the inlet of the 1$^{st}$ REF unit to the inlet of the 2nd REF unit;
$v_{x20}$ is the x-direction velocity at t=$t_2$; and
$v_{y20}$ is the y-direction velocity at t=$t_2$.

Integration of equations [14] and [15] gives position equations as $$x = \frac{qE}{m\omega^2}\{\cos(\phi_0 + \omega(t - T_2)) + \omega(t - t_2)\sin(\phi_0 + \omega(t_2 - T_2)) - \cos(\phi_0 + \omega(t_2 - T_2))\} + v_{x20}(t - t_2) + x_{20}$$ [16]

$$y = \frac{qE}{m\omega^2}\{\sin(\phi_0 + \omega(t - T_2)) - \omega(t - t_2)\cos(\phi_0 + \omega(t_2 - T_2)) - \sin(\phi_0 + \omega(t_2 - T_2))\} + v_{y20}(t - t_2) + y_{20}$$ [17]

where:
$x_{20}$ is the x-position of the ion having mass m at $t=t_2$; and
$y_{20}$ is the y-position of the ion having mass m at $t=t_2$.

Figure 5:
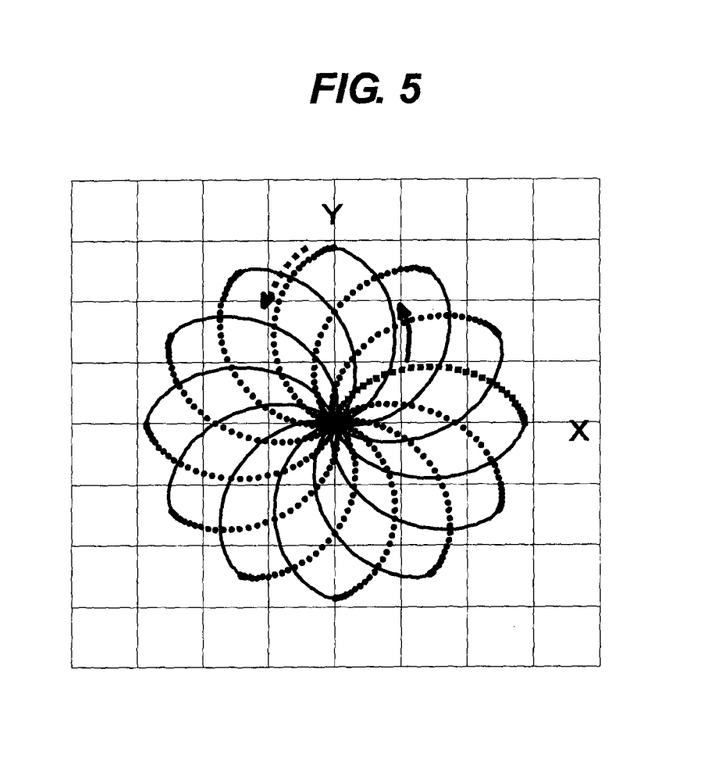
FIG. 5 illustrates trajectories of specified mass ions projected on the X-Y plane.
Figure 6:
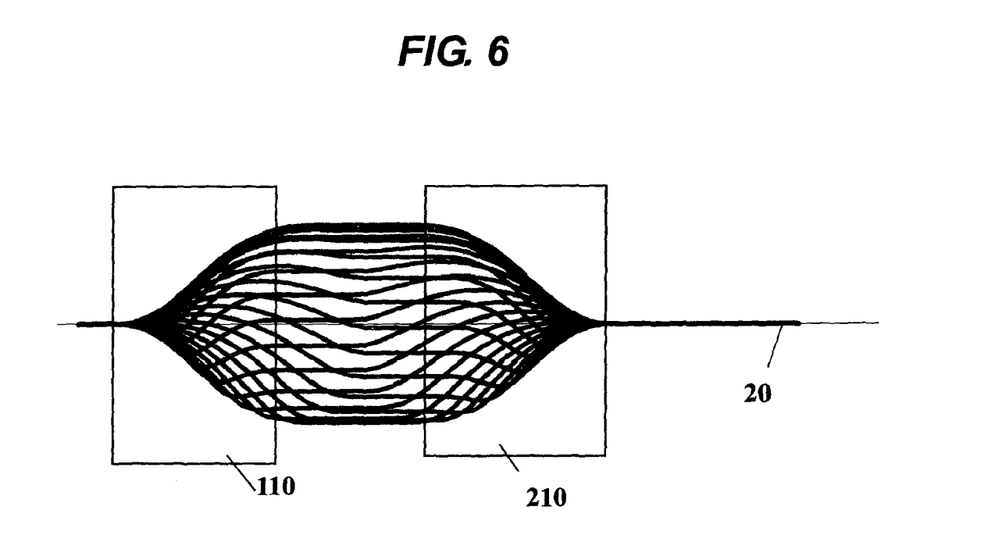
FIG. 6 illustrates a perspective view of trajectories of specified mass ions.
Figure 7:
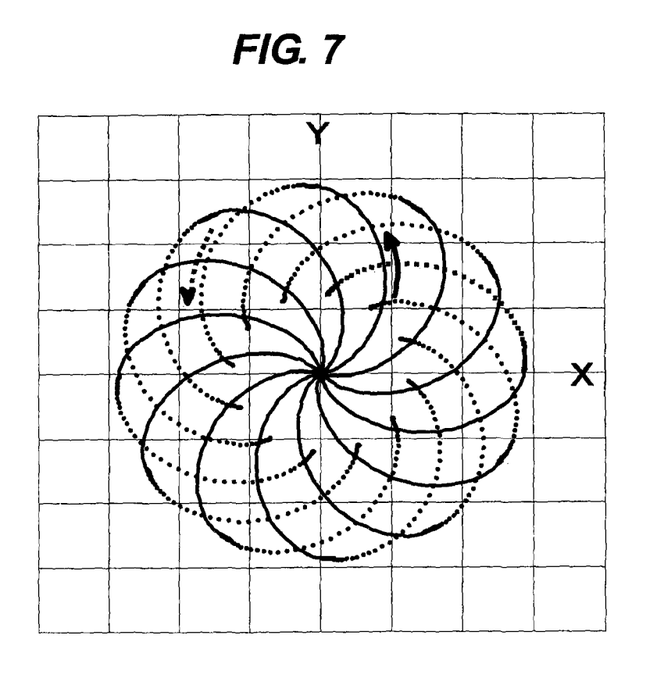
FIG. 7 illustrates trajectories of unspecified mass ions projected on the X-Y plane.
Figure 8:
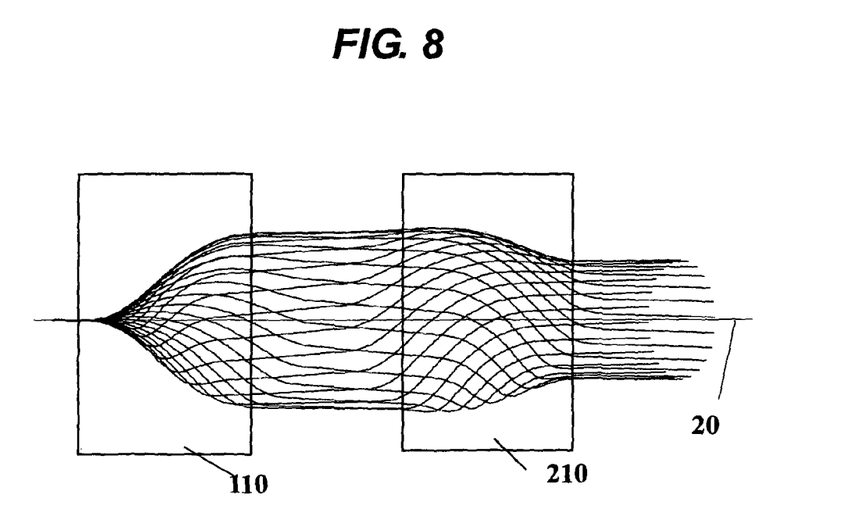
FIG. 8 illustrates a perspective view of trajectories of unspecified mass ions.
Figure 9:
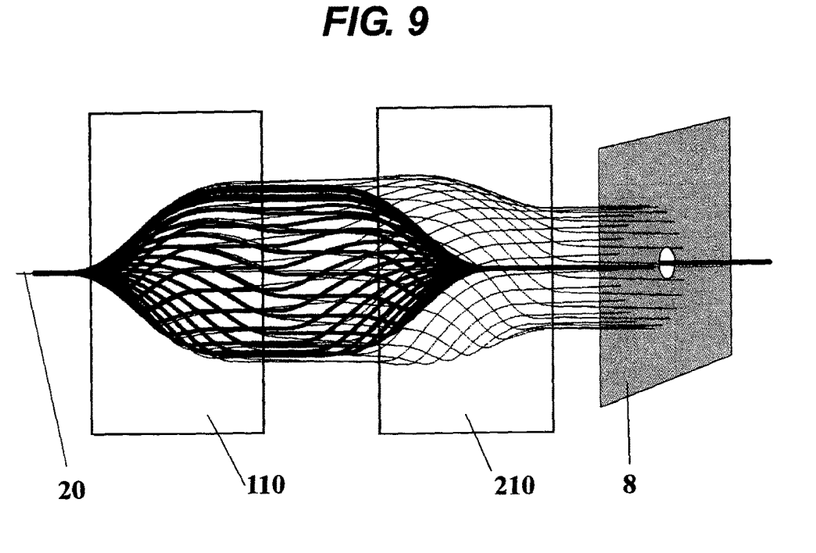
FIG. 9 illustrates how an aperture plate selects specified ions from unspecified ions.

Calculations of equations described above give the trajectories of ions. FIG. 5 illustrates the trajectories of specified mass ions projected on the x-y plane. There are 12 trajectries calculated for every 30 degrees of $\phi_0$. Ions start from the origin: (x, y)=(0, 0), diverge outward within the $1^{st}$ REF unit (drawn in solid lines) and return to the origin within the $2^{nd}$ REF unit (drawn in dashed lines). FIG. 6 illustrates the perspective view of 24 trajectories of the specified mass ions calculated for every 15 degrees of $\phi_0$. The trajectories show divergence of the ions within the $1^{st}$ REF region 110 and convergence of the ions on to the central axis within the $2^{nd}$ REF region 210. FIG. 7 illustrates the trajectories of the unspecified mass ions projected on the x-y plane. In this case, the end points of the trajectories have some distance from the origin corresponding to the mass difference. FIG. 8 illustrates the perspective view of the trajectories of the unspecified mass ions. Here, ions converge deviating from the central axis and travel with certain distance from the central axis 20 tracing hollow cones. FIG. 9 illustrates how the aperture plate 8 works. The aperture plate separates ions by allowing passage of the specified mass ions through the aperture and forbidding passage of unspecified mass ions.

Figure 10:
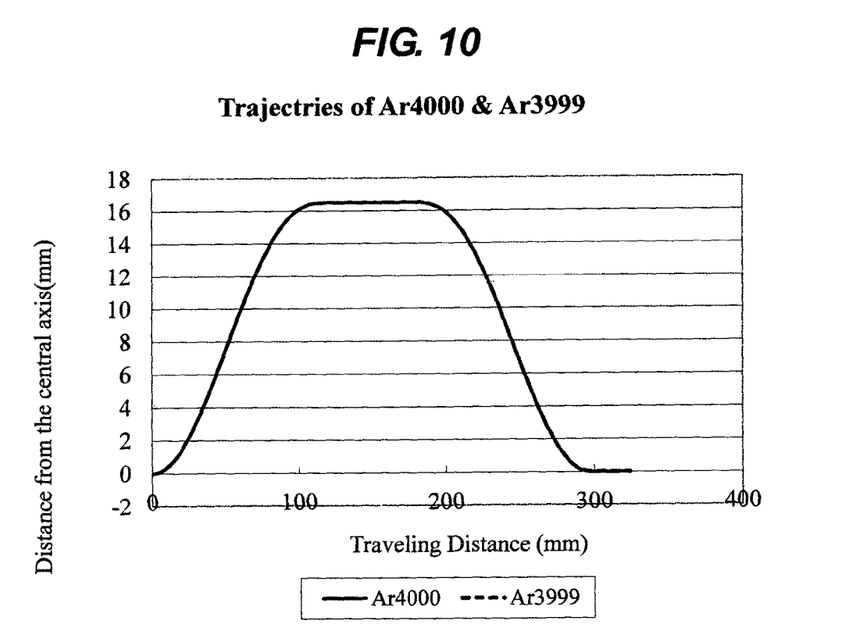
FIG. 10 is a graph indicating distance (mm) of dispersed ions from the central axis vs. flight distance (mm).
Figure 11:
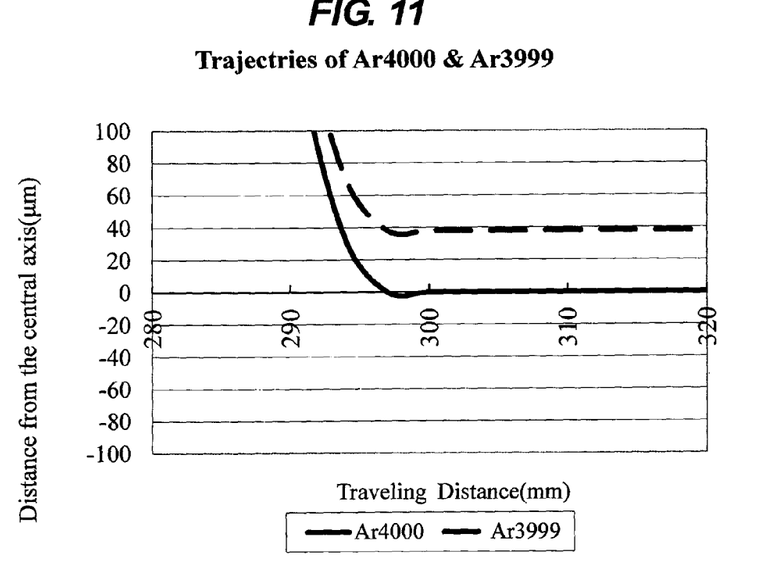
FIG. 11 is a graph indicating the difference of trajectories between 4,000 atoms Argon cluster ions and 3,999 atoms Argon cluster ions.

FIG. 10 shows the trajectories of a cluster ion beam consisting of Ar4,000 (a cluster consisting of 4,000 Ar atoms) and Ar3,999 (a cluster consisting of 3,999 Ar atoms). FIG. 11 illustrates the enlarged trajectories of FIG. 10 between the traveling distances from 280 mm to 320 mm showing that clusters comprising Ar3,999 travel by 38 μm apart from the trajectories of clusters comprising Ar4,000. When an aperture plate has 30 μm diameters, clusters comprising Ar4,000 are separated from clusters comprising Ar3,999. That means an analyzer of the present invention can analyze ions having atomic mass unit 160,000 Da, with mass resolution 4,000.

Figure 12:
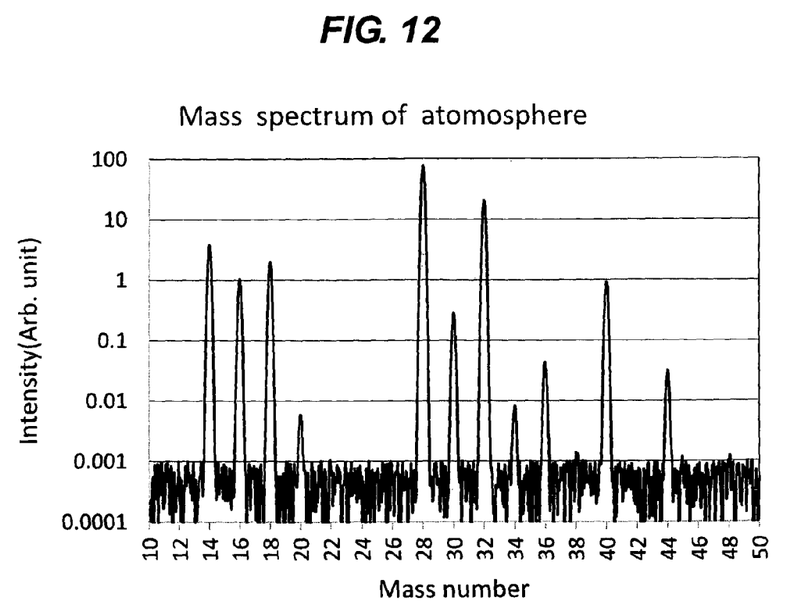
FIG. 12 is an example of a spectrum of mass analysis of the atmosphere.

From aforementioned reasons, the present invention works as a mass spectrometer when the period or the frequency of the sinusoidal signals are changed continuously. Placing an ion current measurement device 14 adjacent the downstream end of the aperture plate 8, the display 23 shows the amount of the current of selected ions. Changing the period of sinusoidal signals continuously, the mass of selected ions changes also continuously, and the result shows a spectrum of included ions. FIG. 12 is an example of a simulation of mass analysis of the atmosphere.

Figure 13:
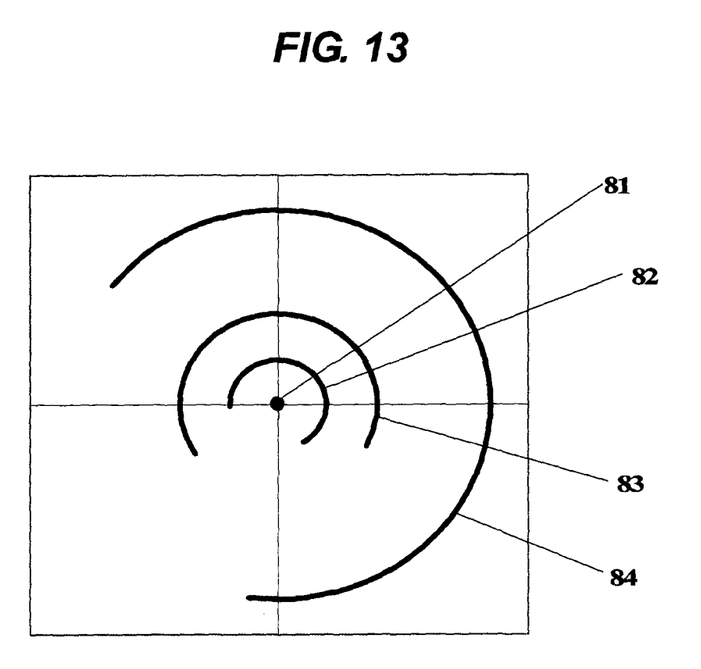
FIG. 13 illustrates circle patterns of dispersed ions detected by a 2-D charge sensitive detector.

The present invention also has a function as a mass spectrograph. When a 2-D charge sensitive detector 13 is located on the measurement position, circle patterns will appear on the display 21 as illustrated in FIG. 13. The specified mass ions collide against the 2-D charge sensitive detector on the center and a bright point appears on the center of circles on the display. Unspecified mass ions collide against the 2-D charge sensitive detector apart from the center and draw circles having different radius on the display corresponding to each mass. When a beam trimmer 12 is set on the working position to stop a part of ion beams sprayed in a hollow cone, the circles become partly blinded and wane on the display. Each waned portion lies on a different angular position corresponding to the mass of ions. The radius and the angular position of each wane indicate the mass number of ions. FIG. 13 shows a result of a simulation of analysis of the atmosphere. The period of sinusoidal signals is equalized to the transit time of an oxygen molecule in the $1^{st}$ REF unit. The center point 81 corresponds to $O_2$. The circle 82, the circle 83 and the circle 84 correspond to $N_2$, $CO_2$, and $H_2O$ respectively.

INDUSTRIAL APPLICABILITY

The present invention is applicable to a mass analyzing apparatus including two rotating electric fields for dispersing ions, and may find application of a mass-analyzing filter in an ion beam optical column or of a mass analyzer in a secondary ion mass spectrometer. The invention is applicable to a small and lightweight mass analyzing apparatus having an ability to analyze ions in the range of mass from 1 to over 100,000 Da, enabling continuous separation of ions.

The invention claimed is:
1. A mass analyzer comprising:
two rotating electric field units, each of the two rotating electric field units having a plurality of elongated electrodes parallel to and equidistant from a central axis which runs through a center of an inlet to the two rotating electric field units and a center of an outlet of the two rotating electric field units, along which ions have travelled, the two rotating electric field units lined in tandem, leaving a drift space for ions between the two rotating electric field units; and
a plurality of high frequency sinusoidal signal generators configured to generate and apply high frequency sinusoidal signals to the plurality of elongated electrodes of each of the two rotating electric field units, such that
i) high frequency sinusoidal signals applied to the plurality of elongated electrodes of a first rotating electric field unit of the two rotating electric field units, having a period equal to a transit time of a specified mass ion in the first rotating electric field unit and a phase difference from each other to rotate an electric field within the first rotating electric field unit, make ions entering the first rotating electric field unit at the center of the inlet diverge outward within the first rotating electric field unit and leave the first rotating electric field unit having a certain distance from the central axis, and make specified mass ions travel the drift space parallel to the central axis, and
(ii) high frequency sinusoidal signals applied to the plurality of elongated electrodes of a second rotating electric field unit of the two rotating electric field units, having a period equal to the period of the high frequency sinusoidal signals applied to the first rotating electric field unit and a phase difference from each other to rotate an electric field within the second rotating electric field unit, with a phase angle of the rotating electric field of the second rotating electric field unit at $t=T_2$ differing from a phase angle of the rotating electric field of the first rotating electric field unit at $t=0$ by $\pi$ radians, make specified mass ions entering the second rotating electric field unit converge on to the central axis and leave the second rotating electric field unit at the center of the outlet, and make unspecified mass ions converge to off axis directions and leave the second rotating electric field unit at off axis positions of the outlet, where t=0 is the time at which specified mass ions enter the first rotating electric field unit and $T_2$ is the transit time of specified mass ions from an inlet of the first rotating electric field unit to an inlet of the second rotating electric field unit.

2. A mass analyzer as claimed in claim 1, further comprising:
one of an aperture plate for separating specified mass ions from unspecified mass ions and a 2-D charge sensitive detector for detecting dispersed ions, each of the aperture plate and the 2-D charge sensitive detector adjacent a downstream end of the second rotating electric field unit.

3. A mass analyzer as claimed in claim 2, further comprising:
an ion current measurement device adjacent a downstream end of the aperture plate.

4. A method of operating a mass analyzer including two rotating electric field units and a plurality of high frequency sinusoidal signal generators, the method comprising:
providing the two rotating electric field units, each of the two rotating electric field units having a plurality of elongated electrodes parallel to and equidistant from a central axis which runs through a center of an inlet to the two rotating electric field units and a center of an outlet of the two rotating electric field units, along which ions have travelled, the two rotating electric field units lined in tandem, leaving a drift space for ions between the two rotating electric field units;
providing the plurality of high frequency sinusoidal signal generators; and
generating and applying, using the plurality of high frequency sinusoidal signal generators, high frequency sinusoidal signals to the plurality of elongated electrodes of each of the two rotating electric field units, such that (i) high frequency sinusoidal signals applied to the plurality of elongated electrodes of a first rotating electric field unit of the two rotating electric field units, having a period equal to a transit time of a specified mass ion in the first rotating electric field unit and a phase difference from each other to rotate an electric field within the first rotating electric field unit, make ions entering the first rotating electric field unit at the center of the inlet diverge outward within the first rotating electric field unit and leave the first rotating electric field unit having a certain distance from the central axis, and make specified mass ions travel the drift space parallel to the central axis, and (ii) high frequency sinusoidal signals applied to the plurality of elongated electrodes of a second rotating electric field unit of the two rotating electric field units, having a period equal to the period of the high frequency sinusoidal signals applied to the first rotating electric field unit and a phase difference from each other to rotate an electric field within the second rotating electric field unit, with a phase angle of the rotating electric field of the second rotating electric field unit at t=$T_2$ differing from a phase angle of the rotating electric field of the first rotating electric field unit at t=0 by $\pi$ radians, make specified mass ions entering the second rotating electric field unit converge on to the central axis and leave the second rotating electric field unit at the center of the outlet, and make unspecified mass ions converge to off axis directions and leave the second rotating electric field unit at off axis positions of the outlet, where t=0 is the time at which specified mass ions enter the first rotating electric field unit and $T_2$ is the transit time of specified mass ions from an inlet of the first rotating electric field unit to an inlet of the second rotating electric field unit.

* * * * *